United States Patent [19]
Bokisa

[11] Patent Number: 5,698,087
[45] Date of Patent: Dec. 16, 1997

[54] PLATING BATH AND METHOD FOR ELECTROPLATING TIN AND/OR LEAD

[75] Inventor: George S. Bokisa, Fairview Park, Ohio

[73] Assignee: McGean-Rohco, Inc., Cleveland, Ohio

[21] Appl. No.: 849,466

[22] Filed: Mar. 11, 1992

[51] Int. Cl.$^6$ .................. C25D 3/32; C25D 3/36
[52] U.S. Cl. .......... 205/254; 205/252; 205/299; 205/302; 106/1.25
[58] Field of Search .............. 205/252, 253, 205/254, 299, 302; 106/1.25

[56] References Cited

U.S. PATENT DOCUMENTS

| | | | |
|---|---|---|---|
| 3,785,939 | 1/1974 | Hsu | 204/435 |
| 3,875,029 | 4/1975 | Rosenberg et al. | 204/435 |
| 3,905,878 | 9/1975 | Dohi et al. | 204/435 |
| 3,926,749 | 12/1975 | Passal | 205/254 |
| 4,132,610 | 1/1979 | Dohi et al. | 204/435 |
| 4,331,518 | 5/1982 | Wilson | 204/435 |
| 4,565,609 | 1/1986 | Nobel et al. | 204/44.4 |
| 4,565,610 | 1/1986 | Nobel et al. | 204/44.4 |
| 4,599,149 | 7/1986 | Nobel et al. | 204/44.4 |
| 4,617,097 | 10/1986 | Nobel et al. | 204/44.4 |
| 4,871,429 | 10/1989 | Nobel et al. | 205/254 |
| 5,039,576 | 8/1991 | Wilson | 428/626 |

FOREIGN PATENT DOCUMENTS 139692  11/1981  Japan .................. 205/254

*Primary Examiner*—Kathryn L. Gorgos
*Assistant Examiner*—Kishor Mayekar
*Attorney, Agent, or Firm*—Renner, Otto, Boisselle & Sklar

[57] ABSTRACT

It now has been found that a smooth and level deposit of tin, lead or tin-lead alloy can be deposited on a substrate from an aqueous plating bath which comprises (A) at least one bath-soluble metal salt selected from the group consisting of a stannous salt, a lead salt, or a mixture of stannous and lead salts, (B) an acid selected from the group consisting of sulfuric or fluoboric acid; and (C) an effective amount of at least one soluble bismuth salt of an alkane sulfonic acid or an alkanol sulfonic acid. Optionally, the aqueous plating bath may further comprise (D) at least one surfactant.

25 Claims, No Drawings

PLATING BATH AND METHOD FOR ELECTROPLATING TIN AND/OR LEAD

BACKGROUND OF THE INVENTION

This invention relates to the electrodeposition of tin, lead, and tin-lead alloys, and particularly to a plating bath which contains at least one soluble bismuth salt of an alkane sulfonic acid or alkanol sulfonic acid and which deposits smooth and level tin, lead and/or tin-lead alloy coatings.

Aqueous acidic plating baths for depositing tin and/or lead coatings on substrates have been known in the art, and most of these baths contain, in addition to the water-soluble tin and/or lead salts, fluoborates, fluosilicates, sulfates, sulfamates, etc. Plating baths containing fluoborate have been used widely to permit high-speed, uniform metal plating of tin, lead or tin-lead alloys. However, baths containing fluoborates generally are quite corrosive and toxic, requiring special equipment which is expensive and presents difficulties in operation, including the disposal of waste water.

An aqueous acidic bath for electroplating tin-bismuth alloy upon a metal object such as a frame of a computer including fluoboric acid, tin fluoborate and a bismuth oxide-bismuth sulfate mixture is described in U.S. Pat. No. 3,663,384. The concentration of bismuth ions is from 0.01 to 0.05 grams per liter.

U.S. Pat. No. 4,331,518 describes electroplating baths containing tin ions and a chelate salt comprising an acid bismuth sulfate gluconate. The bath produces a tin-lead alloy which is resistant to the effects of tin pests and the formation of tin whiskers.

U.S. Pat. No. 4,565,609 describes a bath for the electrodeposition of tin, lead, and tin-lead alloys which comprises a lead and/or tin alkyl sulfonate, an alkyl sulfonic acid in sufficient amount to impart a Ph of below about 3 to the bath, and various additives to improve the brightness of the deposits and other properties. The various additives include quaternary nitrogen wetting agents, alkylene oxides, pyridine compounds, aromatic aldehydes, acid aldehyde and/or a bismuth compound. The bismuth compounds are used in the bath to improve the low current density brightness of the deposits. Bismuth nitrate is an example of an acceptable bismuth compound. U.S. Pat. Nos. 4,565,610 and 4,599,149 also describe similar tin, lead and tin-lead containing baths which contain lead and/or tin alkyl sulfonate, alkyl sulfonic acids and, optionally, bismuth compounds such as bismuth nitrate.

U.S. Pat. No. 5,039,576 describes a bath and method for electrodepositing a tin-bismuth alloy onto a conductive substrate. The bath comprises tin and bismuth ion in aqueous solution, and an alkyl sulfonic or polysulfonic acid or salt as the electrolyte. The sulfonic acid component is present in an amount sufficient to maintain the bismuth in solution. The alloy which is deposited contains greater than 10% bismuth, and in a preferred embodiment, the alloy is the eutectic mixture of tin and bismuth. In particular, the baths contain alkyl sulfonic or polysulfonic acids or their salts. Thus, baths may comprise stannous methane sulfonate, bismuth methane sulfonate and methane sulfonic acid.

U.S. Pat. No. 4,617,097 also describes electroplating baths for tin, lead and tin-lead alloys which contain a lead and/or tin alkyl or alkyloyl sulfonate, an excess of an alkyl or alkyloyl sulfonic acid sufficient to bring the Ph of the bath below about 3, and various additives that are reported to improve the brightness of the deposits, the useful current density ranges, and/or the solderability of tin-lead alloy deposits. Such additives include certain alkylene oxide compounds, quaternary nitrogen wetting agents containing a fatty acid radical, aromatic aldehydes, acetaldehydes and/or bismuth compounds. Bismuth nitrate is an example of a bismuth salt which can be included in the baths.

SUMMARY OF THE INVENTION

It now has been found that a smooth and level deposit of tin, lead or tin-lead alloy can be deposited on a substrate from an aqueous plating bath which comprises (A) at least one bath-soluble metal salt selected from the group consisting of a stannous salt, a lead salt, or a mixture of stannous and lead salts, (B) an acid selected from the group consisting of sulfuric or fluoboric acid; and (C) an effective amount of at least one soluble bismuth salt of an alkane sulfonic acid or an alkanol sulfonic acid. Optionally, the aqueous plating bath may further comprise (D) at least one surfactant.

DESCRIPTION OF THE PREFERRED EMBODIMENTS

The plating baths of the present invention comprise tin ions, lead ions, or a mixture of tin and lead ions, an acid from the group consisting of sulfuric or fluoboric acid, an effective amount of at least one soluble bismuth salt of an alkane sulfonic acid or alkanol sulfonic acid, and, optionally and preferably, at least one surfactant. The optional surfactant may be any suitable amphoteric, nonionic, cationic or anionic surfactant and, preferably, is a cationic or anionic surfactant.

The plating baths of the present invention contain water-soluble stannous salts, water-soluble lead salts, or mixtures thereof, depending on the metal or metals to be deposited by the bath on the substrate. Obviously, when a tin deposit is desired, the lead ion is omitted from the bath, and, conversely, when a lead deposit is desired, the stannous ion is omitted from the bath. Generally, the anion of the metal salt corresponds to the anion of the acid used in the bath. For example, when sulfuric acid is used in the plating bath, the salts may be stannous sulfate or lead sulfate, and when the acid is fluoboric acid, the salts are generally stannous fluoborate and lead fluoborate.

The amount of metal ion or ions in the bath may vary over a wide range depending upon the desired properties of the plating to be deposited on a substrate. Generally, from about 5 to about 350 grams per liter or more of the metal ion or ions will be included in the plating baths of the invention. The amount of sulfuric or fluoboric acid included in the baths also may vary over a wide range such as from 50 to about 500 grams per liter. Generally, the aqueous acidic plating baths of the invention are maintained at a pH of less than about 3.

The bismuth salts of alkane sulfonic acids (C) are derived from alkane sulfonic acids represented by the following Formula I:

$$RSO_3H \qquad (I)$$

wherein R is an alkyl group containing from about 1 to about 12 carbon atoms and more preferably, from about 1 to 6 carbon atoms. Examples of such alkane sulfonic acids include, for example, methane sulfonic acid, ethane sulfonic acid, propane sulfonic acid, 2-propane sulfonic acid, butane sulfonic acid, 2-butane sulfonic acid, pentane sulfonic acid, hexane sulfonic acid, decane sulfonic acid and dodecane sulfonic acid. Bismuth salts of the individual alkane sulfonic acids or mixtures of any of the above alkane sulfonic acids can be utilized in the plating baths of the invention.

The bismuth salts of alkanol sulfonic acids (C) are derived from alkanol sulfonic acids represented by the following Formula II:

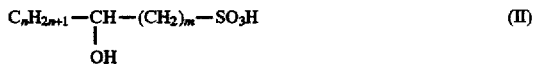

$$C_nH_{2n+1}-\underset{\underset{OH}{|}}{CH}-(CH_2)_m-SO_3H \quad (II)$$

wherein n is from 0 to about 10, m is from 1 to about 11 and the sum of m+n is from 1 up to about 1. As can be seen from the above Formula II, the hydroxy group may be a terminal or internal hydroxy group. Examples of useful alkanol sulfonic acids include 2-hydroxy ethyl-1-sulfonic acid, 1-hydroxy propyl-2-sulfonic acid, 2-hydroxy propyl-1-sulfonic acid, 3-hydroxy-propyl-1-sulfonic acid, 2-hydroxy butyl-1-sulfonic acid, 4-hydroxy butyl-1-sulfonic acid, 2-hydroxy-pentyl-1-sulfonic acid, 4-hydroxy-pentyl-1-sulfonic acid, 2-hydroxy-hexyl-1-sulfonic acid, 2-hydroxy decyl-1-sulfonic acid, 2-hydroxy dodecyl-1-sulfonic acid.

The alkane sulfonic acids and alkanol sulfonic acids are available commercially and can also be prepared by a variety of methods known in the art. One method comprises the catalytic oxidation of mercaptans or aliphatic sulfides having the formula $R_1S_nR_2$ wherein $R_1$ or $R_2$ are alkyl groups and n is a positive integer between 1 and 6. Air or oxygen may be used as the oxidizing agent, and various nitrogen oxides can be employed as catalysts. The oxidation generally is effected at temperatures below about 150° C. Such oxidation processes are described and claimed in U.S. Pat. Nos. 2,433,395 and 2,433,396. Alternatively, chlorine can be used as the oxidizing agent. Bismuth salts of such acids are prepared, for example, by dissolving bismuth trioxide in a hot concentrated aqueous solution of an alkane or alkanol sulfonic acid.

The concentration of the soluble bismuth salt of an alkane sulfonic acid or alkanol sulfonic acid (C) in the plating baths of the invention is generally an amount which provides less than about 10 grams of bismuth ions per liter of bath, and in one embodiment, less than about 2 g/l. In one preferred embodiment, the bath contains from about 0.05 to about 1.5 g/l of bismuth ions.

It is within the scope of the invention to optionally include in the plating bath: (D), one or more surfactants compatible with each of the bath soluble metal salts (A), the acids (B) and the soluble bismuth salts (C). In general, the plating baths of the present invention will optionally contain at least one surfactant in a concentration of from about 0.01 to about 50 grams per liter of bath and more preferably from about 0.05 to about 20 grams per liter of bath. As noted above, the surfactant (D) may be at least one surfactant including amphoteric, nonionic, cationic, or anionic surfactants; or mixtures thereof. More often, the surfactant (D) is at least one cationic or anionic surfactant; or mixtures thereof.

A variety of nonionic surfactants which can be utilized in the present invention are the condensation products of ethylene oxide and/or propylene oxide with compounds containing a hydroxy, mercapto or amino group containing at least one N—H. Examples of materials containing hydroxyl groups include alkyl phenols, styrenated phenols, fatty alcohols, fatty acids, polyalkylene glycols, etc. Examples of materials containing amino groups include alkylamines and polyamines, fatty acid amides, etc.

Examples of nonionic surfactants useful in the plating baths of the invention include ether containing surfactants having the Formula III:

$$R-O-[(CH_2)_nO]_xH \quad (III)$$

wherein R is an aryl or alkyl group containing from about 6 to 20 carbon atoms, n is two or three, and x is an integer between 2 and 100. Such surfactants are produced generally by treating fatty alcohols or alkyl or alkoxy substituted phenols or naphthols with excess ethylene oxide or propylene oxide. The alkyl carbon chain may contain from about 14 to 24 carbon atoms and may be derived from a long chain fatty alcohol such as oleyl alcohol or stearyl alcohol.

Nonionic polyoxyethylene compounds of this type are described in U.S. Pat. No. 3,855,085. Such polyoxyethylene compounds are available commercially under the general trade designations "Surfynol" by Air Products and Chemicals, Inc. of Wayne, Pa., and under the designation "Pluronic" or "Tetronic" by BASF Wyandotte Corp. of Wyandotte, Mich. Examples of specific polyoxyethylene condensation products useful in the invention include "Surfynol 465" which is a product obtained by reacting about 10 moles of ethylene oxide with 1 mole of tetramethyldecyn-ediol. "Surfynol 485" is the product obtained by reacting 30 moles of ethylene oxide with tetramethyldecynediol. "Pluronic L 35" is a product obtained by reacting 22 moles of ethylene oxide with polypropylene glycol obtained by the condensation of 16 moles of propylene oxide.

Alkoxylated amine, long chain fatty amine, long chain fatty acid, alkanol amines, diamines, amides, alkanol amides and polyglycol-type surfactants known in the art are also useful. One type of amine surfactant found particularly useful in a tin or lead plating bath is the group obtained by the addition of a mixture of propylene oxide and ethylene oxide to diamines. More specifically, compounds formed by the addition of propylene oxide to ethylene diamine followed by the addition of ethylene oxide are useful and are available commercially from BASF Wyandotte, Ind. Chemical Group under the general trade designation "Tetronic".

Carbowax-type surfactants which are polyethylene glycols having different molecular weights also are useful. For example Carbowax No. 1000 has a molecular weight range of from about 950 to 1050 and contains from 20 to 24 ethoxy units per molecule. Carbowax No. 4000 has a molecular weight range of from about 3000 to 3700 and contains from 68 to 85 ethoxy units per molecule. Other known nonionic glycol derivatives such as polyalkylene glycol ethers and methoxy polyethylene glycols which are available commercially can be utilized as surfactants in the compositions of the invention.

Ethylene oxide condensation products with fatty acids also are useful non-ionic surfactants. Many of these are available commercially such as under the general tradename "Ethofat" from Armak Ind. Examples include condensate of coco acids, oleic acid, etc. Ethylene oxide condensates of fatty acid amides, e.g. oleamide, also are available from Armak Ind.

In some of the baths, improved results are obtained when polyoxyalkylated glycols, phenols and/or naphthols are included. For example ethylene oxide and propylene oxide condensates with aliphatic alcohols, sorbitan alkyl esters, alkyl, alkoxy and styrenated phenols and naphthols are useful additives. About 6 to about 40 moles of the oxide may be condensed with the above identified compound. Many of these condensates are available commercially under such trade names as "Tween" from ICI America, "Triton" from Rohm & Haas Co., "Tergitol" from Union Carbide, and "Igepal" from General Aniline and Film Corp.

The surfactants (D) utilized in the plating baths of the present invention also may be amphoteric surfactants. The preferred amphoteric surfactants include betaines and sulfobetatnes, and sulfated or sulfonated adducts of the condensation products of ethylene oxide and/or propylene oxide with an alkyl amine or diamine. The betaines may be represented by the general Formula IV:

wherein $R^1$ is an alkyl group containing from about 8 to 20 carbon atoms, and $R^2$ and $R^3$ are alkyl groups containing from 1 to about 4 carbon atoms.

Typical betaines include lauryldimethylammonium betaine and stearyl dimethylammonium betaine. Sulfated and sulfonated adducts include Triton QS-15 (Rohm & Haas Co.), a sulfated adduct of an ethoxylated alkylamine, Miranol HS, a sodium salt of a sulfonated lauric derivative, Miranol OS, a sodium salt of a sulfonated oleic acid, etc.

Cationic surfactants also are useful in the plating baths of the present invention and such surfactants may be selected from the group consisting of higher alkyl amine salts, quaternary ammonium salts, alkyl pyridinium salts and alkyl imidazolium salts.

Cationic surfactants obtained by condensation of various amounts of ethylene oxide or propylene oxide with primary fatty amines are useful and may be represented by the following Formula V:

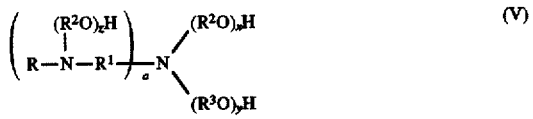

wherein R is a fatty acid alkyl group containing from about 8 to about 22 carbon atoms, $R^1$ is an alkylene radical containing up to about 5 carbon atoms, $R^2$ and $R^3$ are each independently an ethylene or propylene group, a is 0 or 1, and x, y and z are each independently integers from 1 to about 30, and the sum of x, y, and z is an integer of from about 2 to about 50.

More particularly, the alkoxylated amines utilized in the baths of the invention are represented by the Formulae VI and VII:

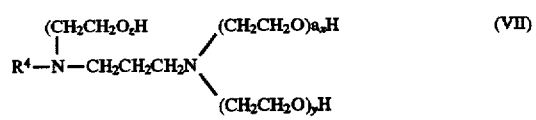

wherein $R^4$ is a fatty acid alkyl group containing from 12 to 18 carbon atoms, and x, y and z are as defined in Formula V.

The above described cationic surfactants are known in the art and are available from a variety of commercial sources. The surfactants of the type represented by Formula VI can be prepared by condensing various amounts of ethylene oxide with primary fatty amines which may be a single amine or a mixture of amines such as are obtained by the hydrolysis of tallow oils, sperm oils, coconut oils, etc. Specific examples of fatty acid amines containing from 8 to 22 carbon atoms include saturated as well as unsaturated aliphatic amines such as octyl amine, decyl amine, lauryl amine, stearyl amine, oleyl amine, myristyl amine, palmityl amine, dodecyl amine, and octadecyl amine.

The alkoxylated amines which are useful in the plating baths of the invention can be prepared as mentioned above, by condensing alkylene oxides with the above-described primary amines by techniques known to those in the art. A number of such alkoxylated amines is commercially available from a variety of sources.

The above described amines can be prepared, as mentioned above, by condensing alkylene oxides with the above-described primary amines by techniques known to those in the art. A number of such alkoxylated amines is commercially available from a variety of sources. The alkoxylated amines of the type represented by Formula VI are available from the Armak Chemical Division of Akzona, Inc., Chicago, Ill., under the general trade designation "Ethomeen". Specific examples of such products include "Ethomeen C/15" which is an ethylene oxide condensate of a coconut fatty amine containing about 5 moles of ethylene oxide; "Ethomeen C/20" and "C/25" which also are ethylene oxide condensation products from coconut fatty amine containing about 10 and 15 moles of ethylene oxide respectively; "Ethomeen S/15" and "S/20" which are ethylene oxide condensation products with stearyl amine containing about 5 and 10 moles of ethylene oxide per mole of amine respectively; and "Ethomeen T/15" and "T/25" which are ethylene oxide condensation products of tallow amine containing about 5 and 15 moles of ethylene oxide per mole of amine respectively. Commercially available examples of the alkoxylated amines of the type represented by formula (5) include "Ethoduomeen I/13" and "T/20" which are ethylene oxide condensation products of N-tallow trimethylene diamine containing about 3 and 10 moles of ethylene oxide per mole of diamine respectively.

Another type of useful cationic surfactant is represented by the Formula VIII:

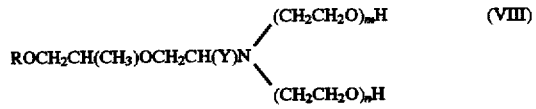

where R is an alkyl group containing from about 8 to about 12 carbon atoms, Y is a methyl or a hydroxyl group, m and n are integers, the sum of which is from about 2 to about 20.

The amine ethoxylate surfactants of the type represented by Formula VIII exhibit the characteristics of both cationic and nonionic surfactants with the nonionic properties increasing at the higher levels of ethoxylation. That is, as the sum of x and y increases, the ethoxylated amine behaves more like a nonionic surfactant.

The surfactants represented by Formula VIII wherein Y is a methyl group are available commercially such as from Texaco Chemical Company under the trade designation "M-300 Series". The M-300 Series compounds currently available from Texaco and which have been found to be useful in the aqueous acid plating baths of the invention include those designated as M-302, M-305, M-310, M-315 and M-320 which contain a total to 2, 5, 10, 15 and 20 moles of ethylene oxide respectively. In all of these compounds, R is a mixture of 10 and 12 carbon alkyl groups.

The cationic surfactant also may be:

(a) a quaternary ammonium salt of the Formula IX:

wherein X represents a halogen, a hydroxyl group, or the residue of a $C_{1-5}$ alkanesulfonic acid; $R_1$ represents alkyl group R' and R" represent a $C_{1-4}$ alkyl group; and R"' represents a $C_{1-10}$ alkyl group or a benzyl group;

(b) pyridinium salts represented by the general Formula X:

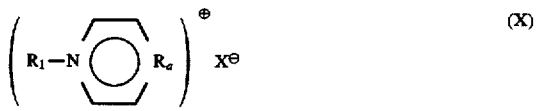

wherein X represents a halogen, a hydroxyl group, or the residue of a $C_{1-5}$ alkanesulfonic acid; $R_1$ represents a $C_{8-20}$ alkyl group; and $R_a$ represents hydrogen or a $C_{1-4}$ alkyl group;

(c) imidazolinium salts represented by the general Formula XI:

wherein X represents a halogen, a hydroxyl group, or the residue of a $C_{1-10}$ alkanesulfonic acid; $R_1$ represents a $C_{8-20}$ alkyl group; $R_d$ represents a hydroxy-containing $C_{1-5}$ alkyl group; and R''' represents a $C_{1-10}$ alkyl group or a benzyl group; and (d) higher alkyl amine salts represented by the general Formula XII:

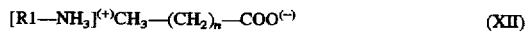

wherein $R_1$ represents a $C_{8-20}$ alkyl group; and n is from about 0 to about 4.

Examples of the above described cationic surfactants, in the form of salts, are lauryltrimethylammonium salt, cetyltrimethylammonium salt, stearyltrimethylammonium salt, lauryldimethylethylammonium salt, octadecyldimethylethylammonlum salt, dimethylbenzyllaurylammonium salt, cetyldimethylbenzylammonium salt, octadecyldimethylbenzylammonium salt, trimethylbenzylammonium salt, triethylbenzylammonium salt, hexadecylpyridinium salt, laurylpyridinium salt, dodecylpicolinium salt, 1-hydroxyethyl-1-benzyl-2-laurylimidazoliniumsalt, 1-hydroxyethyl-1-benzyl-2-oleylimidazoliniumsalt, stearylamine acetate, laurylamine acetate, and octadecylamine acetate.

The surfactants also may be anionic surfactants. Examples of useful anionic surfactants include sulfated alkyl alcohols, sulfated lower ethoxylated alkyl alcohols, and their salts such as alkali metal salts. Examples of such surfactants include sodium lauryl sulfate (Duponol C or QC from DuPont), sodium mixed long chain alcohol sulfates available from DuPont under the designation Duponol WN, sodium octyl sulfate available from Alcolac, Ltd. under the designation Sipex OLS, Sodium tridecyl ether sulfate (Sipex EST), sodium lauryl ether sulfate (Sipon ES), magnesium lauryl sulfate (Sipon LM), the ammonium salt of lauryl sulfate (Sipon L-22), diethanolamino lauryl sulfate (Sipon LD), sodium dodecylbenzene sulfonate (Siponate DS), etc.

Antioxidants normally used in tin, lead and tin/lead baths may be included in the baths of this invention. For example catechol (1,2-dihydroxybenzene) is useful as an antioxidant stabilizer in the baths and prevents air oxidation of stannous to stannic tin. Generally amounts of from about 0.05 to about 2 grams of antioxidant per liter of bath is sufficient.

The acid, tin, lead, and tin-lead plating baths of the present invention which contain at least one soluble bismuth salt of an alkane sulfonic acid or alkanol sulfonic acid, deposit a smooth and level coating of the metal or alloy on substrates at any conventional temperature used or normally used with tin and/or lead plating baths, and over a wide current density range such as from 1 to 2000 amperes per square foot (ASF).

The following examples (except for the control example) illustrate the plating baths of the invention. Unless otherwise indicated in the following examples and elsewhere in the specification and claims, all parts and percentages are by weight, temperatures are in degrees Celsius, and pressure is at or near atmospheric pressure.

The utility of the plating baths of the present invention in depositing metal coatings is demonstrated by conducting plating tests in standard 267 ml Hull cells using tin as the anode. Steel (or brass) panels are plated at a current of 1 amp for a period of three (3) minutes. Mild mechanical bath agitation is employed, and the bath temperature is maintained at about 20° to about 25° C. The results of the plating tests are shown below.

EXAMPLE 1

An aqueous plating bath is prepared by mixing with water, sufficient quantities of stannous sulfate to provide 15 g/l of stannous ion, 10% by volume of sulfuric acid, 0.4 cc of a 100 gram per liter solution of the bismuth salt of methane sulfonic acid (0.16 g/l as bismuth metal), 2% by weight of an aqueous mixture containing 35 grams per liter of Ethomeen T/20 and 2.5 grams per liter of catechol, and 2% by weight of a solution of 75 ml. of Dupanol SP (an anionic sodium alcohol sulfate) per liter of water. The bismuth salt used in this example is prepared by dissolving 111 grams of bismuth trioxide in 1 liter of hot 40% by volume, 70% methane sulfonic acid.

Plating is effected with this bath in a hull cell at room temperature. A complete end-to-end panel coverage is achieved.

CONTROL EXAMPLE 1

A steel panel is plated with the plating bath of Example 1 except that the bath does not contain the bismuth salt. The bath produces a satin finish from the HCD to 2 ASF. The plate then fades to a skip plate at 1 ASF and is void approaching zero.

EXAMPLE 2

The bath is prepared similar to the bath of Example 1 except the bath contains only 0.08 g/l of bismuth. Essentially the same results are obtained as in Example 1 when a panel is electroplated with this bath.

EXAMPLE 3

An aqueous acidic bath is prepared by mixing water with sufficient quantities of stannous fluoborate to provide the bath with about 15 g/l of stannous ion, 200 g/l of fluoboric acid, 2% by weight of an aqueous solution containing 35 grams per liter of Ethomeen T/20 and 2.5 grams per liter of catechol, and 2% of an aqueous solution containing 75 ml. of Dupanol SP per liter. A plating test is conducted with this bath, and the resulting panel exhibits a large low current density improvement.

EXAMPLE 4

An aqueous bath is prepared containing 15 g/l of stannous tin, 10% sulfuric acid, 1 cc of the bismuth salt of methane sulfonic acid, 2% by weight of an aqueous mixture containing 35 g/l of Ethomeen T/20 and 2.5 grams per liter of catechol, and 2% by weight of an aqueous solution containing 75 ml. per liter of Dupanol SP. Brass panels and steel panels are plated at 20 ASF for 12 minutes with this bath. The deposits on the panels and the appearance of matte acid tin.

In order to demonstrate quantitatively the increase in LD covering power obtained by the plating baths of the present invention, steel panels are plated at 1 ampere for 3 minutes using the plating baths of Examples 1 and 2 of the invention and the bath of Control Example 1. The panels are subjected to X-ray fluorescence analysis, and the thicknesses are reported in microinches for a given current density. The results of this test are summarized in the following table.

TABLE

|  | ASF | | | |
| --- | --- | --- | --- | --- |
|  | 6 | 4 | 2 | 0.5 |
| Control Example 1 Standard Acid Tin | 63 | 50 | 36 | 15 |
| Example 1 Containing 0.16 g/l Bi | 62 | 40 | 39 | 34 |
| Example 2 Containing 0.08 g/l Bi | 65 | 41 | 46 | 36 |

As can be seen from the above results, the inclusion of a small amount of bismuth significantly improves the low current density covering power.

In practice, the improved tin, lead, and tin-lead alloy plating baths containing the compositions of the invention may be operated on a continuous or intermittent basis, and from time to time, components of the bath have to be replenished. The various components may be added singularly as required or may be added in combination. The amounts of the various additive compositions to be added to the plating baths may be varied over a wide range depending on the nature and performance of the plating bath to which the composition is added. Such amounts can be determined readily by one skilled in the art.

The electroplating baths of the present invention exhibit a significant increase in the throwing power in the low current density (LCD) range. Use of the baths containing the bismuth ions also results in some grain refining.

One of the advantages of the plating baths of the present invention, particularly the tin containing at least one soluble bismuth salt of an alkane sulfonic acid is that the baths reduce whiskering. Whiskering is undesirable because of the aesthetic problems created, and further because of its corrosive nature when present in plating baths. The plating baths of the present invention which do not contain fluoride or fluoborate ions are less corrosive to machinery and glass parts, and also permit the use of titanium and titanium alloy anode baskets. It also has been observed that anode dissolution is improved in the plating baths of the present invention which results in less anode polarization and a reduced amount of stannate tin in the bath.

The coatings deposited from the plating baths of the invention are useful in electronic circuits, electronic devices and electrical connectors. The surface layers of tin, lead and tin-lead alloys can be used as protective layers to prevent corrosion or in a patterning procedure during the fabrication of printed circuits or integrated circuits. The coatings also provide chemically stable surfaces for soldering on printed wire boards, etc.

While the invention has been explained in relation to its preferred embodiments, it is to be understood that various modifications thereof will become apparent to those skilled in the art upon reading the specification. Therefore, it is to be understood that the invention disclosed herein is intended to cover such modifications as fall within the scope of the appended claims.

I claim:

1. An aqueous acidic solution for plating tin, lead or tin-lead alloys on a substrate which comprises
   (A) at least one bath-soluble metal salt selected from the group consisting of stannous salts, lead salts, or a mixture of stannous and lead salts;
   (B) an acid from the group consisting of sulfuric or fluoboric acid; and
   (C) at least one soluble bismuth salt of an alkane sulfonic acid or an alkanol sulfonic acid in an amount to provide a solution containing less than about 10 grams per liter of bismuth ions.

2. The acidic solution of claim 1 wherein (A) is a bath-soluble stannous salt.

3. The acidic solution of claim 1 wherein (B) is sulfuric acid.

4. The acidic solution of claim 1 wherein (B) is fluoboric acid.

5. The acidic bath of claim 1 wherein the alkane sulfonic acid is represented by the formula $$RSO_3H \qquad (I)$$

where R is an alkyl group containing 1 to about 12 carbon atoms, and the alkanol sulfonic acid is represented by the formula $$C_nH_{2n+1}CH(OH)-(CH_2)_m-SO_3H \qquad (II)$$

where n is from 0 to about 10, m is from 1 to about 11 and the sum of m+n is from 1 up to about 12.

6. The acidic solution of claim 5 wherein (C) is a bath-soluble bismuth salt of an alkane sulfonic acid represented by Formula I.

7. The acidic solution of claim 1 wherein (C) is a bismuth salt of methane sulfonic acid.

8. The acidic solution of claim 1 containing less than about 2 g/l of bismuth ion.

9. The acidic solution of claim 1 containing from about 0.05 to about 1.5 g/l of bismuth ion.

10. The acidic solution of claim 1 also containing at least one surfactant including nonionic, cationic, anionic or amphoteric surfactants.

11. The acidic solution of claim 1 also containing at least one cationic surfactant and at least one anionic surfactant.

12. An aqueous acidic tin electroplating bath which comprises
   (A) at least one bath-soluble stannous salt;
   (B) an acid selected from the group consisting of sulfuric or fluoboric acid; and
   (C) at least one bath-soluble bismuth salt of an alkane sulfonic acid in an amount to provide a solution containing from about 0.05 to about 1.5 g/l of bismuth ions.

13. The plating bath of claim 12 wherein the acid (B) is sulfuric acid.

14. The plating bath of claim 12 wherein the acid (B) is fluoboric acid.

15. The plating bath of claim 12 wherein the alkane sulfonic acid is characterized by the formula $$RSO_3H \qquad (I)$$

wherein R is an alkyl group containing from 1 to about 12 carbon atoms.

16. The plating bath of claim 15 wherein R is a methyl group.

17. The plating bath of claim 12 wherein the bismuth salt (C) is prepared by dissolving bismuth oxide in an alkane sulfonic acid.

18. The plating bath of claim 17 wherein the alkane sulfonic acid is methane sulfonic acid.

19. The plating bath of claim 12 also containing at least one surfactant.

20. The plating bath of claim 19 wherein the surfactant is at least one nonionic or anionic surfactant or mixtures thereof.

21. An aqueous plating bath for the electrodeposition of tin which comprises (A) from about 0.5 to about 350 grams per liter of stannous ion;

(B) from about 10 to about 500 grams per liter of sulfuric or fluoboric acid;

(C) from about 0.05 to about 1.5 grams per liter of bismuth ion as the bismuth salt of methane sulfonic acid; and (D) from about 0.01 to about 200 grams per liter of at least one surfactant selected from nonionic and anionic surfactants, or mixtures thereof.

22. The plating bath of claim 21 wherein the acid (B) is sulfuric acid.

23. The plating bath of claim 21 wherein the acid (B) is fluoboric acid.

24. A method of electrodepositing tin, lead or tin-lead alloy on a substrate which comprises electroplating said substrate in the aqueous plating bath of claim 1.

25. A method of electrodepositing tin on a substrate which comprises electroplating said substrate in the aqueous acidic plating bath of claim 21.

* * * * *